US008330471B2

(12) United States Patent
Suda

(10) Patent No.: US 8,330,471 B2
(45) Date of Patent: Dec. 11, 2012

(54) SIGNAL GENERATION AND DETECTION APPARATUS AND TESTER

(75) Inventor: Masakatsu Suda, Saitama (JP)

(73) Assignee: Advantest Corporation, Tokyo (JP)

( * ) Notice: Subject to any disclaimer, the term of this patent is extended or adjusted under 35 U.S.C. 154(b) by 465 days.

(21) Appl. No.: 12/253,246

(22) Filed: Oct. 17, 2008

(65) Prior Publication Data

US 2009/0265597 A1    Oct. 22, 2009

Related U.S. Application Data

(63) Continuation of application No. PCT/JP2007/057491, filed on Apr. 3, 2007.

(30) Foreign Application Priority Data

Apr. 19, 2006 (JP) ................................. 2006-116204

(51) Int. Cl.
*G01R 31/02* (2006.01)
(52) U.S. Cl. .................................. 324/537; 324/758.01
(58) Field of Classification Search .................. 324/537
See application file for complete search history.

(56) References Cited

U.S. PATENT DOCUMENTS

| 4,320,516 | A  | * | 3/1982  | Kammerlander | 375/226 |
|-----------|----|---|---------|--------------|---------|
| 4,757,452 | A  | * | 7/1988  | Scott et al. | 702/69  |
| 5,412,258 | A  | * | 5/1995  | Ogawa et al. | 327/170 |
| 6,327,678 | B1 | * | 12/2001 | Nagai        | 714/700 |
| 7,325,185 | B1 | * | 1/2008  | Szor         | 714/799 |
| 7,386,042 | B1 | * | 6/2008  | Brewer       | 375/226 |
| 2002/0007479 | A1 | * | 1/2002 | Sugimoto et al. | 716/4 |
| 2005/0202800 | A1 | * | 9/2005 | Wang         | 455/404.1 |
| 2006/0184332 | A1 | * | 8/2006 | Ishida et al. | 702/69 |
| 2007/0086378 | A1 | * | 4/2007 | Matta et al.  | 370/329 |

FOREIGN PATENT DOCUMENTS

| JP | 4-191678    | 7/1992  |
|----|-------------|---------|
| JP | 5-45419     | 2/1993  |
| JP | 11-287844   | 10/1999 |
| JP | H11-316260  | 11/1999 |
| JP | 2002-22808  | 1/2002  |
| JP | 2002-228721 | 8/2002  |
| JP | 2006-220660 | 8/2006  |

OTHER PUBLICATIONS

Tadahiko, Baba. Semiconductor Tester, JP2002-228721, machine translation by JPO.*
Masaharu, Yamazaki. Waveform Forming Circuit of Semiconductor Testing Device, JP05-045419, machine translation by JPO.*
"Office Action of Japan Counterpart Application", issued on Apr. 3, 2012, with English translation thereof, p. 1-p. 5.

* cited by examiner

*Primary Examiner* — Thomas Valone
(74) *Attorney, Agent, or Firm* — Jianq Chyun IP Office

(57) ABSTRACT

There is provided a signal output apparatus for outputting a pattern signal. The signal output apparatus includes a pattern generating section that generates waveform data of the pattern signal to be generated, a timing generating section that generates timing signals in accordance with an expected pattern cycle time of the pattern signal, a timing control section that receives the waveform data output from the pattern generating section, and controls output timings of the timing signals to be output from the timing generating section, in accordance with the waveform data, and a waveform shaping section that generates the pattern signal corresponding to data values of the waveform data output from the pattern generating section, in accordance with the timing signals output from the timing generating section.

8 Claims, 9 Drawing Sheets

SIGNAL GENERATION AND DETECTION APPARATUS AND TESTER

CROSS REFERENCE TO RELATED APPLICATION

This is a continuation application of PCT/JP2007/057491 filed on Apr. 3, 2007, which claims priority from a Japanese Patent Application No. 2006-116204 filed on Apr. 19, 2006, the contents of which are incorporated herein by reference.

BACKGROUND

1. Technical Field

The present invention relates to a signal output apparatus, a signal detecting apparatus, a test apparatus, an electronic device and a program. More particularly, the present invention relates to a signal output apparatus for outputting a pattern signal, a signal detecting apparatus for detecting a pattern signal input thereto, a test apparatus for testing a device under test, an electronic device and a program.

2. Related Art

A test apparatus for testing a semiconductor device transmits to the semiconductor device a test signal via a transmission path formed by a socket, a cable, a performance board and the like, and receives an output signal output from the semiconductor device via the transmission path as disclosed in, for example, Japanese Patent Application Publication No. 2006-220660.

FIG. 1 illustrates a test signal or output signal which has passed through a transmission path. FIG. 2 illustrates the relation between the phase and the pulse width of the test signal or output signal which has passed through the transmission path.

When the test or output signal has passed through the transmission path, the high frequency components of the signal are cut off. Therefore, the test or output signal has edges with lowered gradients at the receiving end of the transmission path as shown in FIG. 1. When the gradients of the edges are lowered, a pattern with a relatively short pulse width fails to settle. Specifically speaking, in a pattern with a relatively short pulse width, the trailing edge starts before the leading edge reaches a desired level.

Such a pattern in which the trailing edge starts without a settling time may be two-valued by using a predetermined threshold value to generate a logic value signal. In the logic value signal, the phase of the transition timing of the logic value is earlier than in a logic value signal obtained by two-valuing the original pattern. In other words, a pattern with a relatively short pulse width has jitter generated therein as a result of passing through the transmission path, so that the pulse width becomes shorter than the original width. This jitter is referred to as "pattern dependent jitter". The pattern dependent jitter increases as the pulse width decreases as shown in FIG. 2.

When a test signal suffers from pattern dependent jitter, a test apparatus cannot supply the test signal to a semiconductor device at a designated timing and thus may cause the semiconductor device to perform an operation different from an expected operation. When an output signal suffers from pattern dependent jitter, the test apparatus cannot detect the output signal at a desired timing and thus may wrongly judge that the semiconductor device is defective even though the semiconductor device outputs an expected output signal.

SUMMARY

Therefore, it is an object of an aspect of the innovations herein to provide a signal output apparatus, a signal detecting apparatus, a test apparatus, an electronic device, and a program which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary signal output apparatus may include a signal output apparatus for outputting a pattern signal, including a pattern generating section that generates waveform data of the pattern signal to be generated, a timing generating section that generates timing signals in accordance with an expected pattern cycle time of the pattern signal, a timing control section that receives the waveform data output from the pattern generating section, and controls output timings of the timing signals to be output from the timing generating section, in accordance with the waveform data, and a waveform shaping section that generates the pattern signal corresponding to data values of the waveform data output from the pattern generating section, in accordance with the timing signals output from the timing generating section.

According to the second aspect related to the innovations herein, one exemplary signal detecting apparatus may include a signal detecting apparatus for detecting a pattern signal input thereto, including a first comparing section that detects a logic value of the pattern signal in accordance with a first timing signal having a predetermined cycle time, a second comparing section that detects a logic value of the pattern signal in accordance with a second timing signal having a different phase from the first timing signal, a selection control section that detects a waveform pattern of the pattern signal based on one of (i) the logic value of the pattern signal detected by the first comparing section and (ii) the logic value of the pattern signal detected by the second comparing section, and uses the waveform pattern to judge which one of the logic value detected by the first comparing section and the logic value detected by the second comparing section is to be selected as a data value of each cycle of the pattern signal, and a selecting section that selects one of the logic value output from the first comparing section and the logic value output from the second comparing section based on the judgment made by the selection control section for each cycle of the pattern signal, and outputs the selected logic value.

According to the third aspect related to the innovations herein, one exemplary signal detecting apparatus includes a signal detecting apparatus for detecting a pattern signal input thereto, including a first comparing section that detects a logic value of the pattern signal in accordance with a first timing signal having a predetermined cycle time, a second comparing section that detects a logic value of the pattern signal in accordance with a second timing signal having a different phase from the first timing signal, a third comparing section that detects a logic value of the pattern signal at a substantially middle timing of each cycle of the pattern signal, a selection control section that detects a waveform pattern of the pattern signal based on the logic value of the pattern signal detected by the third comparing section, and uses the waveform pattern to judge which one of the logic value detected by the first comparing section and the logic value detected by the second comparing section is to be selected as a data value of each cycle of the pattern signal, and a selecting section that selects one of the logic value output from the first comparing section and the logic value output from the second comparing section based on the judgment made by the selection control section for each cycle of the pattern signal, and outputs the selected logic value.

According to the fourth aspect related to the innovations herein, one exemplary test apparatus includes a test apparatus for testing a device under test, including a signal generating apparatus that inputs a pattern signal into the device under test, a signal detecting apparatus that detects an output signal output from the device under test, and a judging section that judges whether the device under test is acceptable based on the output signal detected by the signal detecting apparatus. Here, the signal generating apparatus includes a pattern generating section that generates waveform data of the pattern signal to be generated, a timing generating section that generates timing signals in accordance with an expected pattern cycle time of the pattern signal, a timing control section that receives the waveform data output from the pattern generating section, and controls output timings of the timing signals to be output from the timing generating section, in accordance with the waveform data, and a waveform shaping section that generates the pattern signal corresponding to data values of the waveform data output from the pattern generating section, in accordance with the timing signals output from the timing generating section.

According to the fifth aspect related to the innovations herein, one exemplary test apparatus includes a test apparatus for testing a device under test, including a signal generating apparatus that inputs a pattern signal into the device under test, a signal detecting apparatus that detects an output signal output from the device under test, and a judging section that judges whether the device under test is acceptable based on the output signal detected by the signal detecting apparatus. Here, the signal detecting apparatus includes a first comparing section that detects a logic value of the output signal in accordance with a first timing signal having a predetermined cycle time, a second comparing section that detects a logic value of the output signal in accordance with a second timing signal having a different phase from the first timing signal, a selection control section that detects a waveform pattern of the output signal based on one of (i) the logic value of the output signal detected by the first comparing section and (ii) the logic value of the output signal detected by the second comparing section, and uses the waveform pattern to judge which one of the logic value detected by the first comparing section and the logic value detected by the second comparing section is to be selected as a data value of each cycle of the output signal, and a selecting section that selects one of the logic value output from the first comparing section and the logic value output from the second comparing section based on the judgment made by the selection control section for each cycle of the output signal, and outputs the selected logic value.

According to the sixth aspect related to the innovations herein, one exemplary test apparatus includes a test apparatus for testing a device under test, including a signal generating apparatus that inputs a pattern signal into the device under test, a signal detecting apparatus that detects an output signal output from the device under test, and a judging section that judges whether the device under test is acceptable based on the output signal detected by the signal detecting apparatus. Here, the signal detecting apparatus includes a first comparing section that detects a logic value of the output signal in accordance with a first timing signal having a predetermined cycle time, a second comparing section that detects a logic value of the output signal in accordance with a second timing signal having a different phase from the first timing signal, a third comparing section that detects a logic value of the output signal at a substantially middle timing of each cycle of the output signal, a selection control section that detects a waveform pattern of the output signal based on the logic value of the output signal detected by the third comparing section, and uses the waveform pattern to judge which one of the logic value detected by the first comparing section and the logic value detected by the second comparing section is to be selected as a data value of each cycle of the output signal, and a selecting section that selects one of the logic value output from the first comparing section and the logic value output from the second comparing section based on the judgment made by the selection control section for each cycle of the output signal, and outputs the selected logic value.

According to the seventh aspect related to the innovations herein, one exemplary electronic device includes an electronic device including a circuit under test and a test circuit that tests the circuit under test. Here, the test circuit includes a signal generating circuit that inputs a pattern signal into the circuit under test, a signal detecting circuit that detects an output signal output from the circuit under test, and a judging section that judges whether the circuit under test is acceptable based on the output signal detected by the signal detecting circuit. Here, the signal detecting circuit includes a first comparing section that detects a logic value of the output signal in accordance with a first timing signal having a predetermined cycle time, a second comparing section that detects a logic value of the output signal in accordance with a second timing signal having a different phase from the first timing signal, a selection control section that detects a waveform pattern of the output signal based on one of (i) the logic value of the output signal detected by the first comparing section and (ii) the logic value of the output signal detected by the second comparing section, and uses the waveform pattern to judge which one of the logic value detected by the first comparing section and the logic value detected by the second comparing section is to be selected as a data value of each cycle of the output signal, and a selecting section that selects one of the logic value output from the first comparing section and the logic value output from the second comparing section based on the judgment made by the selection control section for each cycle of the output signal, and outputs the selected logic value.

According to the eighth aspect related to the innovations herein, one exemplary electronic device includes an electronic device including a circuit under test and a test circuit that tests the circuit under test. The test circuit includes a signal generating circuit that inputs a pattern signal into the circuit under test, a signal detecting circuit that detects an output signal output from the circuit under test, and a judging section that judges whether the circuit under test is acceptable based on the output signal detected by the signal detecting circuit. Here, the signal detecting circuit includes a first comparing section that detects a logic value of the output signal in accordance with a first timing signal having a predetermined cycle time, a second comparing section that detects a logic value of the output signal in accordance with a second timing signal having a different phase from the first timing signal, a third comparing section that detects a logic value of the output signal at a substantially middle timing of each cycle of the output signal, a selection control section that detects a waveform pattern of the output signal based on the logic value of the output signal detected by the third comparing section, and uses the waveform pattern to judge which one of the logic value detected by the first comparing section and the logic value detected by the second comparing section is to be selected as a data value of each cycle of the output signal, and a selecting section that selects one of the logic value output from the first comparing section and the logic value output from the second comparing section based on the judgment made by the selection control section for each cycle of the output signal, and outputs the selected logic value.

According to the ninth aspect related to the innovations herein, one exemplary program includes a program causing an information processing apparatus to function as a signal output apparatus that outputs a pattern signal. The program causes the information processing apparatus to function as a pattern generating section that generates waveform data of the pattern signal to be generated, a timing generating section that generates timing signals in accordance with an expected pattern cycle time of the pattern signal, a timing control section that receives the waveform data output from the pattern generating section, and controls output timings of the timing signals to be output from the timing generating section, in accordance with the waveform data, and a waveform shaping section that generates the pattern signal corresponding to data values of the waveform data output from the pattern generating section, in accordance with the timing signals output from the timing generating section.

According to the tenth aspect related to the innovations herein, one exemplary program includes a program causing an information processing apparatus to function as a signal detecting apparatus that detects a pattern signal input thereto. The program causes the information processing apparatus to function as a first comparing section that detects a logic value of the pattern signal in accordance with a first timing signal having a predetermined cycle time, a second comparing section that detects a logic value of the pattern signal in accordance with a second timing signal having a different phase from the first timing signal, a selection control section that detects a waveform pattern of the pattern signal based on one of (i) the logic value of the pattern signal detected by the first comparing section and (ii) the logic value of the pattern signal detected by the second comparing section, and uses the waveform pattern to judge which one of the logic value detected by the first comparing section and the logic value detected by the second comparing section is to be selected as a data value of each cycle of the pattern signal, and a selecting section that selects one of the logic value output from the first comparing section and the logic value output from the second comparing section based on the judgment made by the selection control section for each cycle of the pattern signal, and outputs the selected logic value.

Here, all the necessary features of the present invention are not listed in the summary. The sub-combinations of the features may become the invention.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
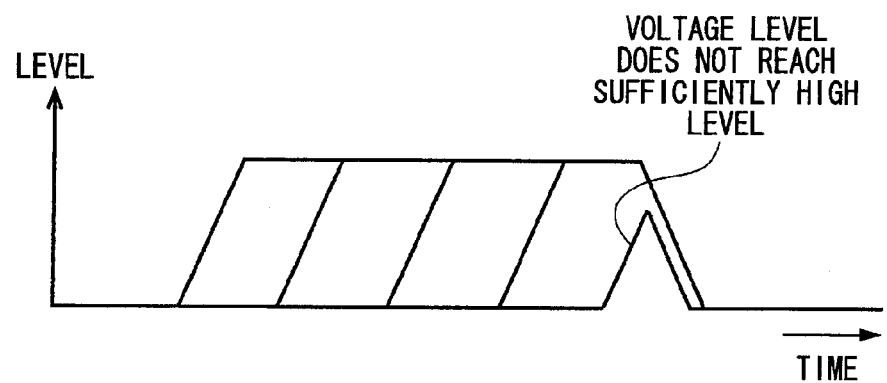
FIG. 1 illustrates the waveform of a test signal (or output signal) which has passed through a transmission path.
Figure 2:
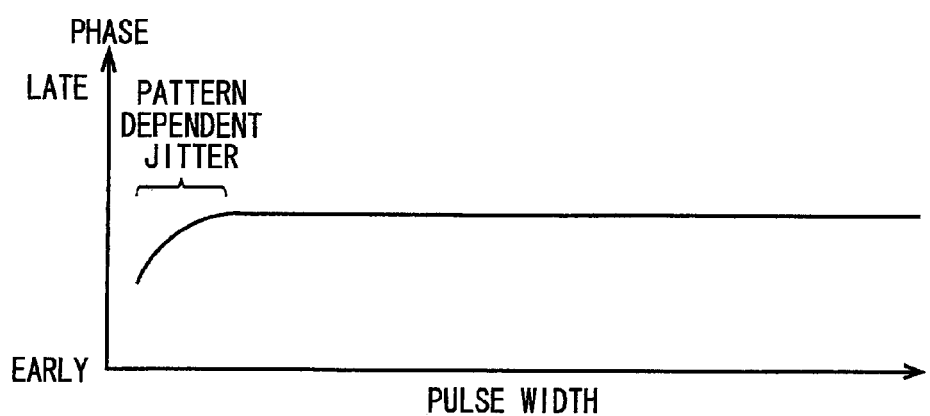
FIG. 2 illustrates the relation between the phase and the pulse width for a test signal (or output signal) which has passed through a transmission path.
Figure 3:
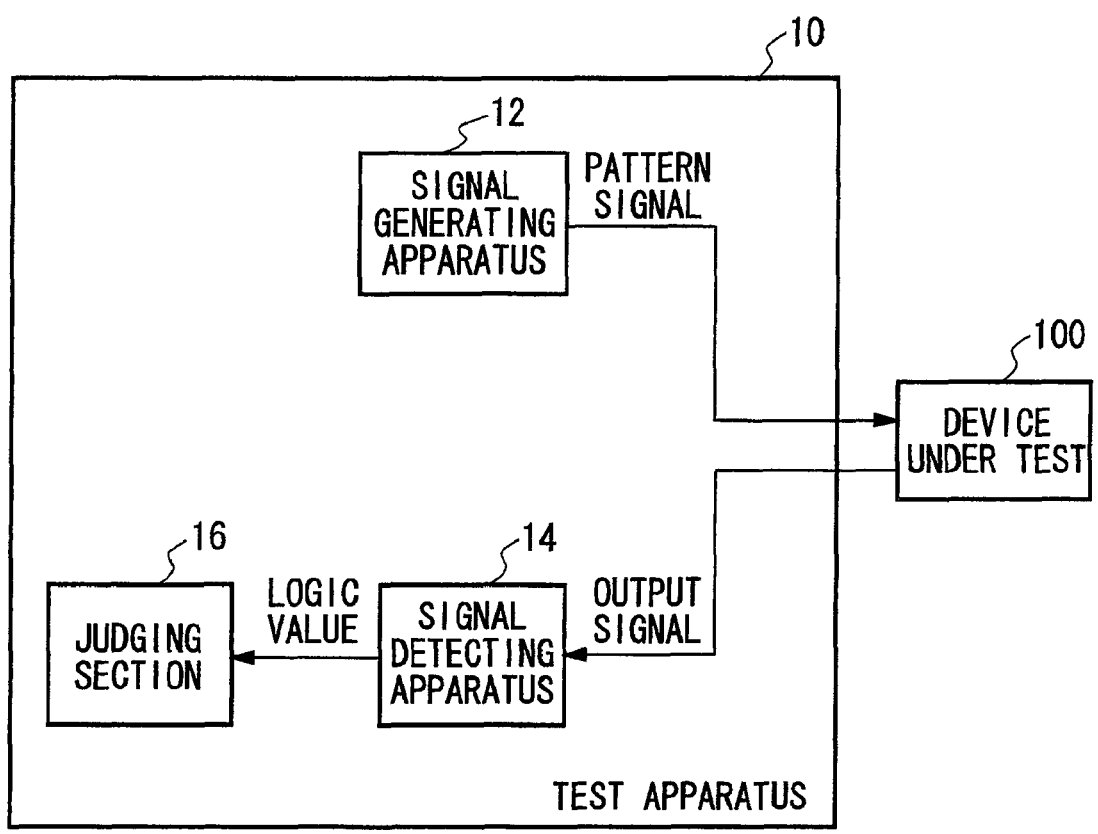
FIG. 3 illustrates the configuration of a test apparatus 10 relating to an embodiment of the present invention, together with a device under test 100.

FIG. 3 illustrates the configuration of a test apparatus 10 relating to an embodiment of the present invention, together with a device under test 100. The test apparatus 10 tests the device under test 100. The test apparatus 10 includes a signal generating apparatus 12, a signal detecting apparatus 14, and a judging section 16. The signal generating apparatus 12 inputs a pattern signal into the device under test 100. The signal detecting apparatus 14 detects an output signal output from the device under test 100. The judging section 16 judges whether the device under test 100 is acceptable based on the output signal detected by the signal detecting apparatus 14.

Figure 4:
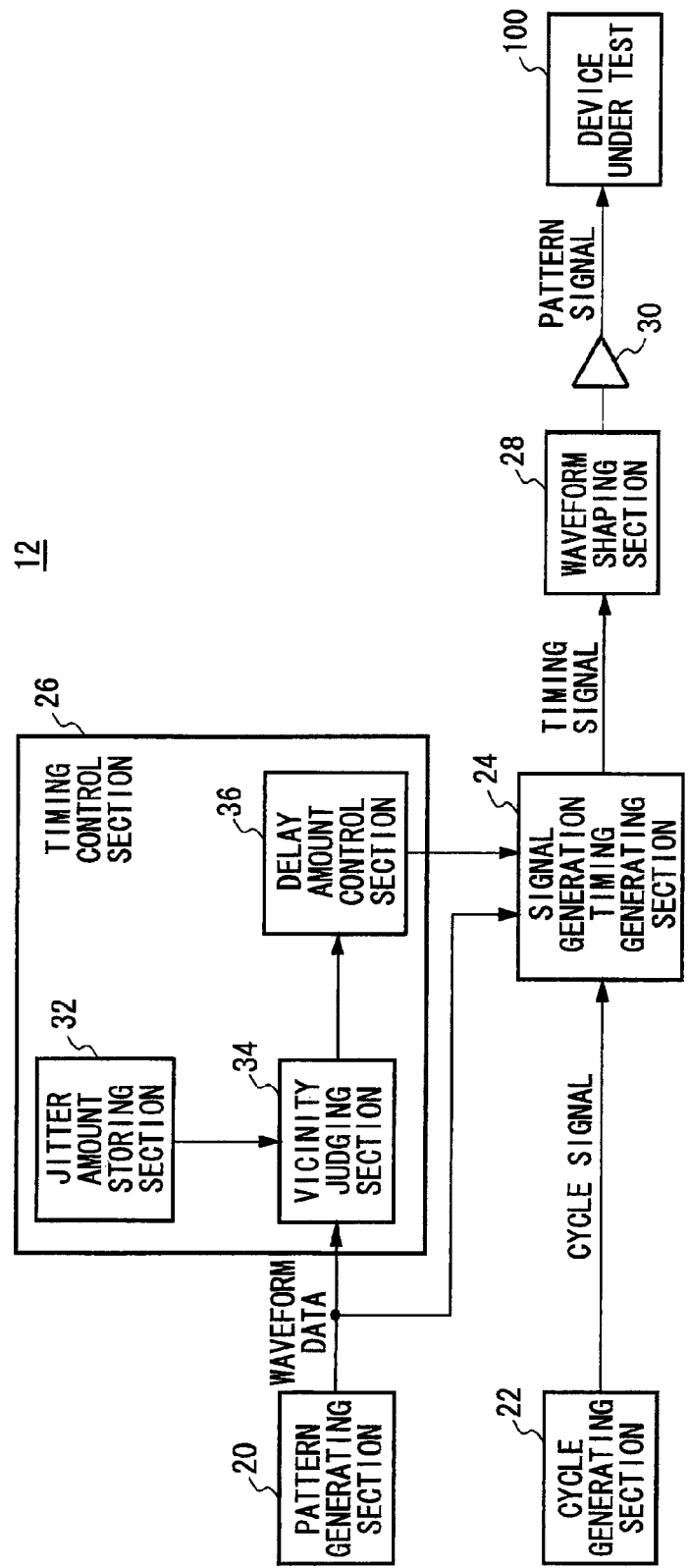
FIG. 4 illustrates the configuration of a signal generating apparatus 12 relating to an embodiment of the present invention, together with the device under test 100.

FIG. 4 illustrates the configuration of the signal generating apparatus 12 relating to the present embodiment, together with the device under test 100. The signal generating apparatus 12 outputs the pattern signal, as a test signal, to the device under test 100. The signal generating apparatus 12 includes a pattern generating section 20, a cycle generating section 22, a signal generation timing generating section 24, a timing control section 26, a waveform shaping section 28, and a driver 30. The pattern generating section 20 generates waveform data of the pattern signal to be generated by the signal generating apparatus 12. For example, the pattern generating section 20 may generate waveform data indicating the timings of the rising and falling edges of the pattern signal at intervals equal to the cycle time of a test cycle.

The cycle generating section 22 generates a cycle signal. For example, the cycle generating section 22 may generate a cycle signal indicating the start timing of each test cycle. The signal generation timing generating section 24 generates a timing signal in accordance with the expected pattern cycle time of the pattern signal. For example, the signal generation timing generating section 24 may generate a timing signal by delaying the cycle signal supplied from the cycle generating section 22, in accordance with the waveform data output from the pattern generating section 20.

The timing control section 26 receives the waveform data output from the pattern generating section 20, and uses the received waveform data to control the output timing of the timing signal output from the signal generation timing generating section 24. For example, when the interval between first transition data and second transition data in the waveform data is smaller than a predetermined interval, the timing control section 26 may control the output timing of the timing signal corresponding to the second transition data to be later than its output timing defined by the pattern cycle time, where the first transition data is a portion of the waveform data which represents data value transition and the second transition data is another portion of the waveform data which represents immediately following data value transition.

When the signal generation timing generating section 24 generates the timing signal by delaying the cycle signal, the timing control section 26 may control the delay amount of each timing signal, for example. When configured to control the delay amount, the timing control section 26 may include a jitter amount storing section 32, a vicinity judging section 34, and a delay amount control section 36, for example. The jitter amount storing section 32 prestores a pattern dependent jitter amount generated when a pattern signal, the edges of which are in the vicinity of each other, is transmitted through a particular transmission path. This is to say, the jitter amount storing section 32 stores the amount of a phase shift generated in a pattern with a relatively short pulse width when the pattern is transmitted through a transmission path. The jitter amount storing section 32 may store a pattern dependent jitter amount generated in a pattern with a relatively short pulse width when the pattern is transmitted through a transmission path extending from the output end of the waveform shaping section 28 to the input end of the device under test 100, for example.

The vicinity judging section 34 judges whether the interval between each transition data in the waveform data and its immediately preceding transition data is smaller than a predetermined interval. The delay amount control section 36 increases the delay amount by which the signal generation timing generating section 24 delays the timing signal corresponding to the transition data which is judged by the vicinity judging section 34 to have a smaller interval than the predetermined interval from the immediately preceding transition data, in accordance with the pattern dependent jitter amount. According to the above-described configuration, when the signal generating apparatus 12 outputs a pattern which is to generate pattern dependent jitter due to a small interval between first transition data and second transition data, the timing control section 26 can control the output timing of the timing signal corresponding to the second transition data to be later than its original output timing defined by the pattern cycle time.

The waveform shaping section 28 generates a pattern signal corresponding to the data value of the waveform data output from the pattern generating section 20, in accordance with the timing signal output from the signal generation timing generating section 24. For example, the waveform shaping section 28 may generate a pattern signal which rises or falls in accordance with the timing signal. The driver 30 supplies the pattern signal output from the waveform shaping section 28 to the device under test 100. For example, the driver 30 supplies the pattern signal to the device under test 100 via the transmission path.

According to the above-described configuration, when transmitting a pattern with a relatively short pulse width via the transmission path, the signal generating apparatus 12 can output a pattern signal which is compensated in advance in terms of the pattern dependent jitter which is to be generated in the pattern. As a result, even when the transmission path generates pattern dependent jitter in the pattern signal, the signal generating apparatus 12 enables the device under test 100 to receive the pattern signal at a designated timing.

Figure 5:
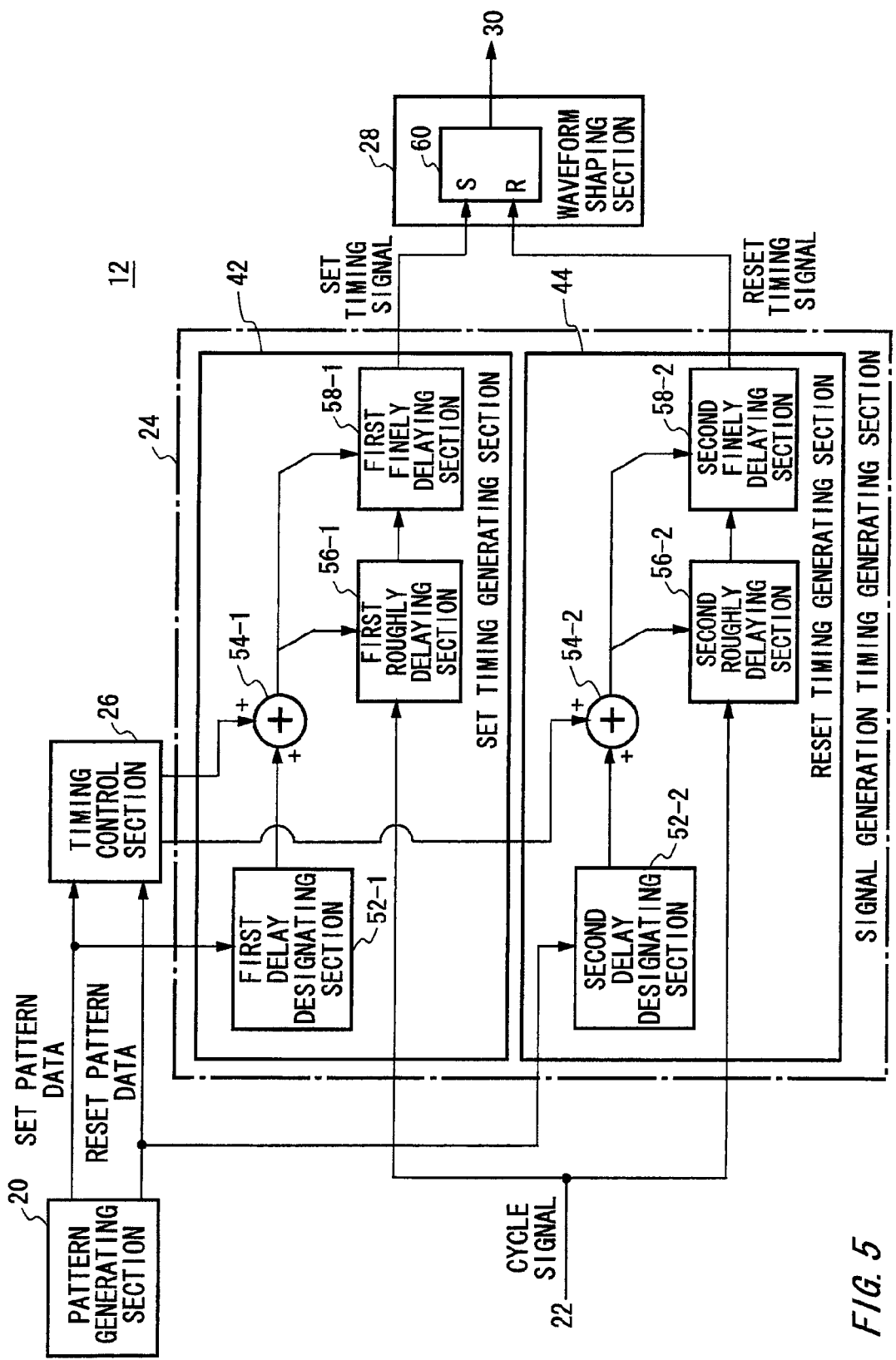
FIG. 5 illustrates the exemplary configurations of a signal generation timing generating section 24 and a waveform shaping section 28 relating to an embodiment of the present invention, together with a pattern generating section 20 and a timing control section 26.

FIG. 5 illustrates the configurations of the signal generation timing generating section 24 and the waveform shaping section 28 relating to an example of the present embodiment, together with the pattern generating section 20 and the timing control section 26. The signal generating apparatus 12 may generate waveform data indicating the timings of the rising and falling edges and generate a pattern signal based on the timings indicated by the waveform data. According to the present example, the pattern generating section 20 generates, as the waveform data, set pattern data defining the pattern of the rising edges of the pattern signal to be generated by the signal generating apparatus 12 and reset pattern data defining the pattern of the falling edges of the pattern signal to be generated by the signal generating apparatus 12.

According to the present example, the signal generation timing generating section 24 generates, as the timing signal, a set timing signal corresponding to the set pattern data and a reset timing signal corresponding to the reset pattern data. For example, the signal generation timing generating section 24 may include a set timing generating section 42 and a reset timing generating section 44. The set timing generating section 42 generates the set timing signal by delaying the cycle signal in accordance with the set pattern data, and the reset timing generating section 44 generates the reset timing signal by delaying the cycle signal in accordance with the reset pattern data.

For example, the set timing generating section 42 may include a first delay designating section 52-1, a first adding section 54-1, a first roughly delaying section 56-1, and a first finely delaying section 58-1. The first delay designating section 52-1 generates a set delay amount in each test cycle based on the set pattern data. Here, the set delay amount indicates the time interval from the start timing of the test cycle to the timing of the rising edge of the pattern signal. The first adding section 54-1 adds together the set delay amount and the set-side pattern dependent jitter amount output from the timing control section 26, and outputs the result of the addition as a compensated delay amount. The first roughly delaying section 56-1 delays the cycle signal, which is generated by the cycle generating section 22 and represents the test pattern cycle time, by a time which is the largest integer multiple of the reference clock cycle time within the compensated delay amount. The first finely delaying section 58-1 further delays the cycle signal, which has been delayed by the first roughly delaying section 56-1, by a time, less than the reference clock cycle time, which is equal to the remaining compensated delay amount, and outputs the resulting signal as the set timing signal.

For example, the reset timing generating section 44 may include a second delay designating section 52-2, a second adding section 54-2, a second roughly delaying section 56-2, and a second finely delaying section 58-2. The second delay designating section 52-2 generates a reset delay amount in each test cycle based on the reset pattern data. Here, the reset delay amount indicates the time interval from the start timing of the test cycle to the timing of the falling edge of the pattern signal. The second adding section 54-2 adds together the reset delay amount and the reset-side pattern dependent jitter amount output from the timing control section 26, and outputs the result of the addition as a compensated delay amount. The second roughly delaying section 56-2 delays the cycle signal, which is generated by the cycle generating section 22 and represents the test pattern cycle time, by a time which is the largest integer multiple of the reference clock cycle time within the compensated delay amount. The second finely delaying section 58-2 further delays the cycle signal, which has been delayed by the second roughly delaying section 56-2, by a time, less than the reference clock cycle time, which is equal to the remaining compensated delay amount, and outputs the resulting signal as the reset timing signal.

The timing control section 26 detects each transition data interval in the waveform data, with reference to the set pattern data and the reset pattern data. The timing control section 26 outputs the set-side pattern dependent jitter amount when it is the output timing of the set timing signal which is controlled to be later than the original timing, and outputs the reset-side pattern dependent jitter amount when it is the output timing of the reset timing signal which is controlled to be later than the original timing.

The waveform shaping section 28 generates a pattern signal which has a rising edge corresponding to the set pattern data at a timing corresponding to the set timing signal and has a falling edge corresponding to the reset pattern data at a timing corresponding to the reset timing signal. For example, the waveform shaping section 28 may include an SR latch 60. The SR latch 60 causes the pattern signal to rise at the timing indicated by the set timing signal and to fall at the timing indicated by the reset timing signal.

Figure 6:
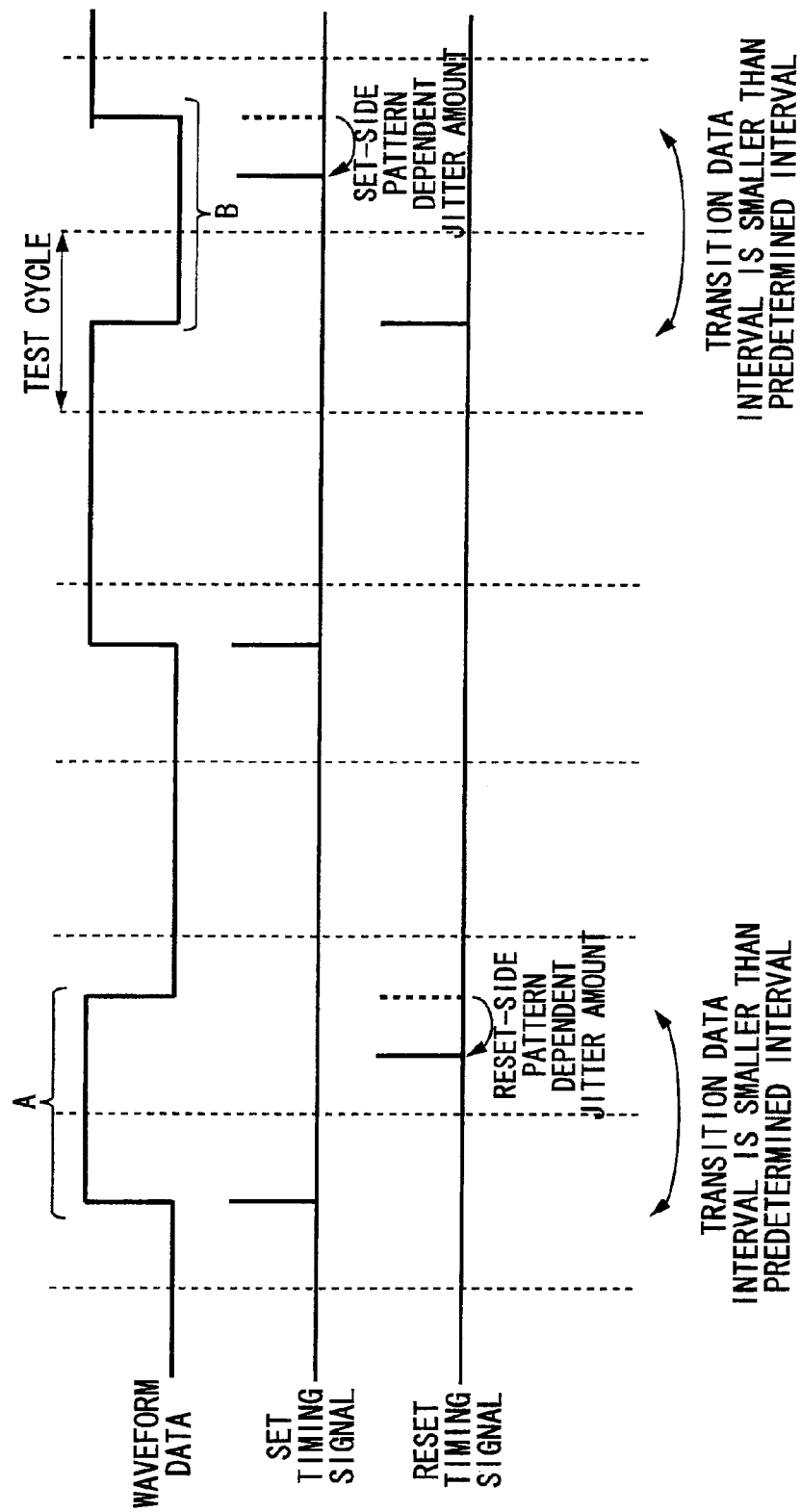
FIG. 6 illustrates examples of waveform data, a set timing signal, and a reset timing signal.

FIG. 6 illustrates examples of the waveform data input into the signal generation timing generating section 24 shown in FIG. 5, the set timing signal and the reset timing signal. The timing control section 26 outputs the reset-side pattern dependent jitter amount when the time interval from the set timing to the reset timing is smaller than a predetermined interval in a pattern that first rises and then falls as referred to by A in FIG. 6. When receiving the reset-side pattern dependent jitter amount from the timing control section 26, the set timing generating section 42 delays the output timing of the reset timing signal for a pattern that first rises and then falls by the reset-side pattern dependent jitter amount.

The timing control section 26 outputs the set-side pattern dependent jitter amount when the time interval from the reset timing to the set timing is smaller than a predetermined interval in a pattern that first falls and then rises as referred to by B in FIG. 6. When receiving the set-side pattern dependent jitter amount, the set timing generating section 42 delays the output timing of the set timing signal for a pattern that first rises and then falls by the set-side pattern dependent jitter amount.

According to the above-described configuration, even when generating a pattern signal based on the set timing signal and the reset timing signal, the signal generating apparatus 12 can output a pattern signal which is compensated in advance in terms of pattern dependent jitter which is to be generated in a pattern having a relatively short pulse width. As a result, the signal generating apparatus 12 enables the device under test 100 to receive the pattern signal at a designated timing even when the transmission path generates pattern dependent jitter in the pattern signal.

For example, the timing control section 26 may change the output timing of the reset timing signal by a different amount than the output timing of the set timing signal. In this manner, even when the signal rising and falling characteristics of the driver 30 are different from each other, the signal generating apparatus 12 enables the device under test 100 to receive both the rising and falling edges at the designated timings.

The timing control section 26 may control the output timing of the timing signal in accordance with the frequency with which the data value transits in the waveform data. For example, when the frequency with which the data value transmits is higher than a predetermined frequency, the timing control section 26 may control the output timing of the timing signal to be earlier than the output timing defined by the pattern cycle time. With such a configuration, even when jitter is generated by the difference in power consumption which is attributed to the difference in the frequency, for example, the voltage drop in the source voltage and the increase in the temperature of the signal generation timing generating section 24, the waveform shaping section 28, and the driver 30, the signal generating apparatus 12 can output a pattern signal which is compensated in advance in terms of such jitter.

Figure 7:
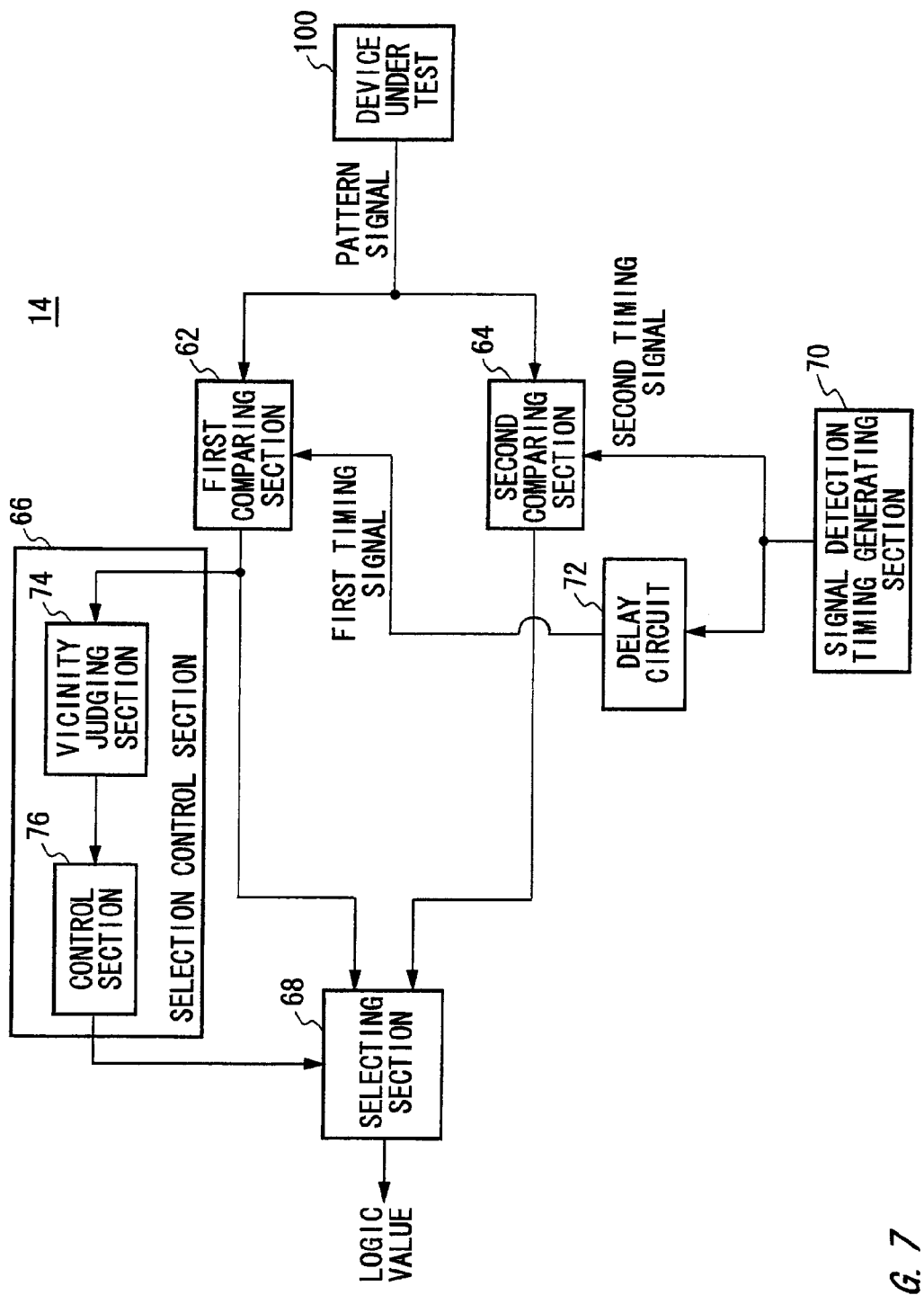
FIG. 7 illustrates the configuration of a signal detecting apparatus 14 relating to an embodiment of the present invention, together with the device under test 100.

FIG. 7 illustrates the configuration of the signal detecting apparatus 14 relating to the present embodiment, together with the device under test 100. The signal detecting apparatus 14 receives, as a pattern signal, the output signal output from the device under test 100 in response to the pattern signal supplied from the signal generating apparatus 12. The signal detecting apparatus 14 detects the logic value of the received pattern signal.

The signal detecting apparatus 14 includes a first comparing section 62, a second comparing section 64, a selection control section 66, a selecting section 68, a signal detection timing generating section 70, and a delay circuit 72. The first comparing section 62 detects the logic value of the pattern signal based on a first timing signal having a predetermined cycle time. In one example, the first comparing section 62 compares the pattern signal with a threshold value at the timing indicated by the first timing signal, to detect the logic value of each cycle of the pattern signal. The second comparing section 64 detects the logic value of the pattern signal based on a second timing signal which has a different phase from the first timing signal. In one example, the second comparing section 64 compares the pattern signal with a threshold value at the timing indicated by the second timing signal, to detect the logic value of each cycle of the pattern signal.

The selection control section 66 detects the waveform pattern of the pattern signal based on the logic value of the pattern signal which is detected by one of the first and second comparing sections 62 and 64, and judges which one of the logic value detected by the first comparing section 62 and the logic value detected by the second comparing section 64 is to be selected as the data value of each cycle of the pattern signal, based on the detected waveform pattern.

For example, the selection control section 66 may include a vicinity judging section 74 and a control section 76. The vicinity judging section 74 judges whether the interval between each transition data of the logic value of the pattern signal which is detected by one of the first and second comparing sections 62 and 64 and its immediately preceding transition data is smaller than a predetermined interval. The control section 76 may cause the selecting section 68 to select the logic value output from the second comparing section 64 for a cycle corresponding to transition data which is judged by the vicinity judging section 74 to have a smaller interval than the predetermined interval from its immediately preceding transition data, and cause the selecting section 68 to select the logic value output from the first comparing section 62 in a different cycle. The selecting section 68 selects one of the logic value output from the first comparing section 62 and the logic value output from the second comparing section 64 for each cycle of the pattern signal, based on the judgment made by the selection control section 66, and outputs the selected logic value.

The signal detection timing generating section 70 generates the second timing signal, which has a predetermined cycle time, and indicates the comparison timing for the second comparing section 64. In one example, the signal detection timing generating section 70 generates a second timing signal that has substantially the same cycle time as the pattern signal. The delay circuit 72 delays the second timing signal to generate the first timing signal, which has a predetermined cycle time, and indicates the comparison timing for the second comparing section 64. For example, the delay circuit 72 may have a delay amount determined in accordance with the pattern dependent jitter amount which is generated in a pattern signal the edges of which are in the vicinity of each other when the pattern signal is transmitted through a particular transmission path. In this manner, the signal detection timing generating section 70 generates a second timing signal that has the same cycle time as the first timing signal and has an earlier phase than the first timing signal by the pattern dependent jitter amount. As a result, the second comparing section 64 can compare the received pattern signal with the threshold value at a timing earlier than the comparison timing of the first comparing section 62 by the pattern dependent jitter amount.

Figure 8:
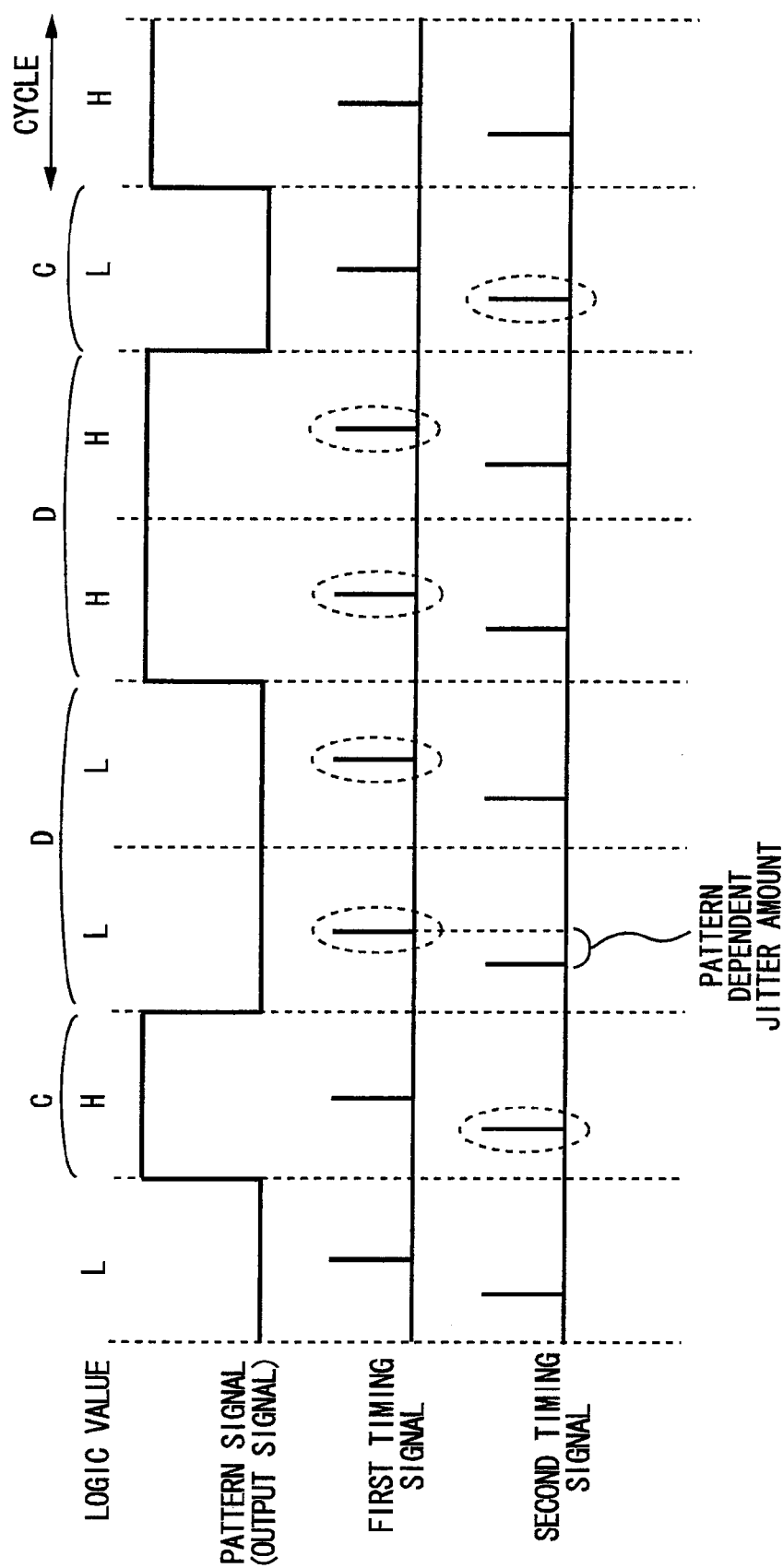
FIG. 8 illustrates examples of an output signal, a first timing signal, and a second timing signal.

FIG. 8 illustrates examples of the pattern signal (output signal) output from the device under test 100, the first timing signal, and the second timing signal. In one example, the selection control section 66 detects a waveform pattern starting with a transition from the L logic to the H logic and ending with a subsequent transition from the H logic to the L logic (for example, the waveform C in FIG. 8) and a waveform pattern starting with a transition from the H logic to the L logic and ending with a subsequent transition from the L logic to the H logic (for example, the waveform D in FIG. 8). When the waveform pattern has a smaller width than a predetermined width, the selection control section 66 causes the selecting section 68 to select the logic value output from the second comparing section 64 for a cycle including the waveform pattern. When the waveform pattern has a width equal to or longer than the predetermined width, the selection control section 66 causes the selecting section 68 to select the logic value output from the first comparing section 62 for a cycle including the waveform pattern.

Such a signal detecting apparatus 14 can use two different phases to detect the logic value of the received pattern signal, select one of the detected logic values in accordance with the waveform pattern, and output the selected logic value. In one example, the signal detecting apparatus 14 detects the logic value of a waveform pattern which has a smaller width than a predetermined width at a timing earlier by a pattern dependent jitter amount than the timing of detecting the logic value of a different waveform pattern. In this manner, the signal detecting apparatus 14 can detect the logic value of a pattern signal that has a relatively short cycle time, at a timing obtained by compensating for the pattern dependent jitter generated in the pattern signal with a relatively short cycle time. As a result, the signal detecting apparatus 14 can detect the logic value of the pattern signal output from the device under test 100 at the timing designated by the device under test 100.

Figure 9:
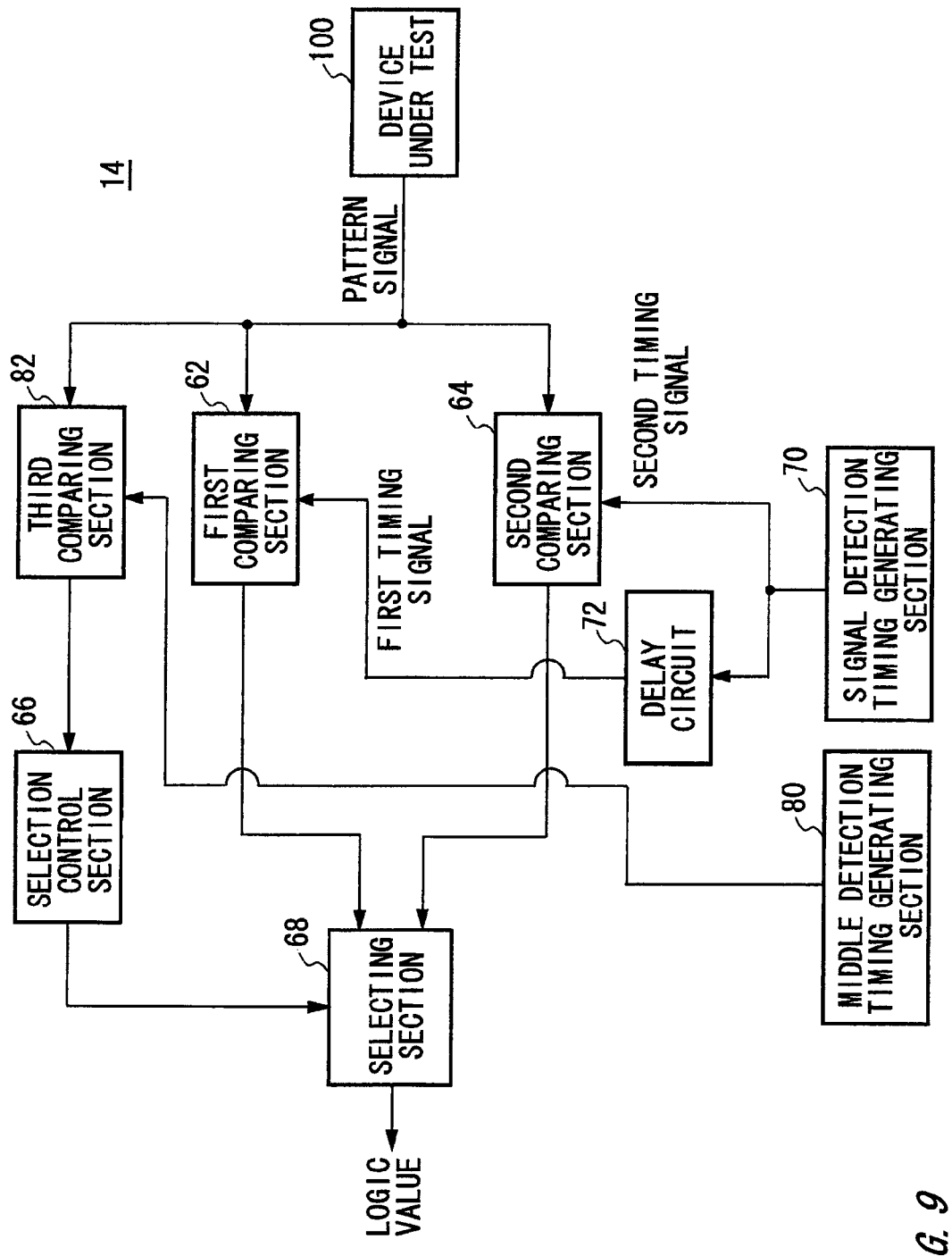
FIG. 9 illustrates the configuration of the signal detecting apparatus 14 relating to a modification example of the embodiment of the present invention, together with the device under test 100.

FIG. 9 illustrates the configuration of the signal detecting apparatus 14 relating to a modification example of the present embodiment, together with the device under test 100. The signal detecting apparatus 14 relating to the modification example of the present embodiment has substantially the same constituents and functions as the signal detecting apparatus 14 shown in FIG. 7, and thus are not explained except for the differences.

The signal detecting apparatus 14 additionally includes a middle detection timing generating section 80 and a third comparing section 82. The middle detection timing generating section 80 generates a substantially middle timing of each cycle of the pattern signal. The third comparing section 82 detects the logic value of the pattern signal at the substantially middle timing of each cycle of the pattern signal, which is generated by the middle detection timing generating section 80. The selection control section 66 detects the waveform pattern of the pattern signal based on the logic value detected by the third comparing section 82, and uses the detected waveform pattern to judge which one of the logic value detected by the first comparing section 62 and the logic value detected by the second comparing section 64 is to be selected as the data value of each cycle of the pattern signal.

According to the above-described present modification example, the signal detecting apparatus 14 determines the width of the waveform pattern based on the logic value detected at the substantially middle timing of each cycle of the pattern signal. Therefore, the signal detecting apparatus 14 can accurately determine the width of the waveform pattern even when the first or second timing signal indicates a timing in the vicinity of the transition point of the pattern signal. As a result, since the signal detecting apparatus 14 relating to the present modification example can accurately identify a waveform pattern affected by pattern dependent jitter, the signal detecting apparatus 14 can accurately judge whether it is necessary to compensate for pattern dependent jitter.

The test apparatus 10 may be a test circuit that is provided in the same electronic device as a circuit under test to be tested. The test circuit is realized as a BIST circuit or the like in the electronic device, and tests the circuit under test to diagnose the electronic device, for example. In this manner, the test circuit can examine whether the circuit under test is capable of performing normal operations, which are originally expected to be performed by the electronic device.

Alternatively, the test apparatus 10 may be a test circuit provided in the same board or apparatus as a circuit under test to be tested. Such a test circuit can also examine whether the circuit under test is capable of performing normal operations, which are originally expected to be performed, as stated above.

Figure 10:
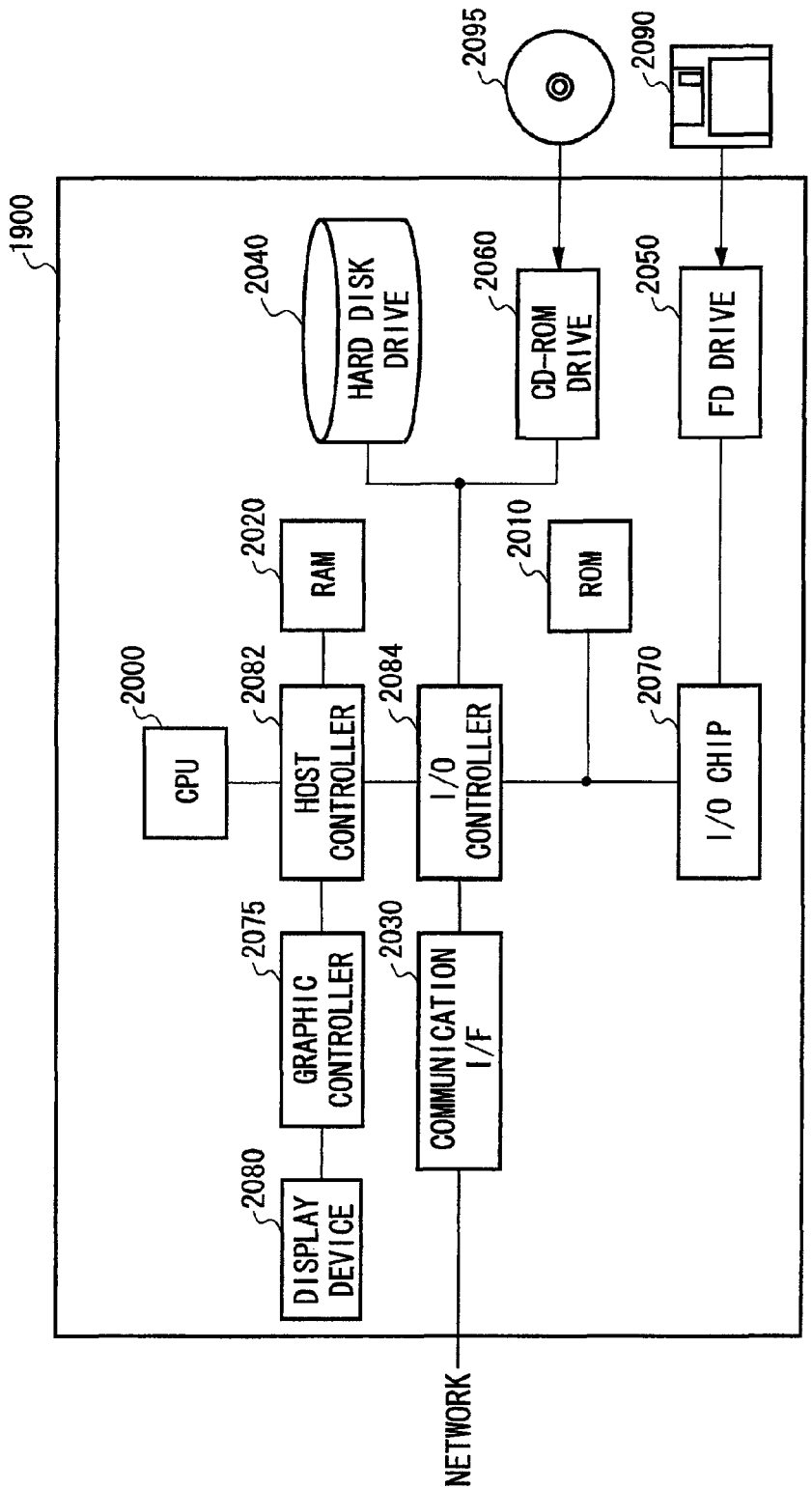
FIG. 10 illustrates an exemplary hardware configuration of a computer 1900 relating to an embodiment of the present invention.

FIG. 10 illustrates an exemplary hardware configuration of a computer 1900 relating to an embodiment of the present invention. The computer 1900 relating to the present embodiment is constituted by a CPU surrounding section, an input/output (I/O) section and a legacy I/O section. The CPU surrounding section includes a CPU 2000, a RAM 2020, a graphic controller 2075 and a display device 2080 which are connected to each other by means of a host controller 2082. The I/O section includes a communication interface 2030, a hard disk drive 2040, and a CD-ROM drive 2060 which are connected to the host controller 2082 by means of an I/O controller 2084. The legacy I/O section includes a ROM 2010, a flexible disk drive 2050, and an I/O chip 2070 which are connected to the I/O controller 2084.

The host controller 2082 connects the RAM 2020 with the CPU 2000 and graphic controller 2075 which access the RAM 2020 at a high transfer rate. The CPU 2000 operates in accordance with programs stored on the ROM 2010 and RAM 2020, to control the constituents. The graphic controller 2075 obtains image data which is generated by the CPU 2000 or the like on a frame buffer provided within the RAM 2020, and causes the display device 2080 to display the obtained image data. Alternatively, the graphic controller 2075 may include therein a frame buffer for storing thereon the image data generated by the CPU 2000 or the like.

The I/O controller 2084 connects, to the host controller 2082, the hard disk drive 2040, communication interface 2030 and CD-ROM drive 2060 which are I/O devices operating at a relatively high rate. The communication interface 2030 communicates with different apparatuses via the network. The hard disk drive 2040 stores thereon programs and data to be used by the CPU 2000 in the computer 1900. The CD-ROM drive 2060 reads programs or data from a CD-ROM 2095, and supplies the read programs or data to the hard disk drive 2040 via the RAM 2020.

The I/O controller 2084 is also connected to the ROM 2010, flexible disk drive 2050 and I/O chip 2070 which are I/O devices operating at a relatively low rate. The ROM 2010 stores thereon a boot program executed by the computer 1900 at the startup, programs dependent on the hardware of the computer 1900, and the like. The flexible disk drive 2050 reads programs or data from a flexible disk 2090, and supplies the read programs or data to the hard disk drive 2040 via the RAM 2020. The I/O chip 2070 is connected to the flexible disk drive 2050, and used to connect a variety of I/O devices to the computer 1900, via a parallel port, a serial port, a keyboard port, a mouse port or the like.

The programs to be provided to the hard disk drive 2040 via the RAM 2020 are provided by a user in the state of being stored on a recording medium such as the flexible disk 2090, the CD-ROM 2095, and an IC card. The programs are read from the recording medium, and the read programs are installed in the hard disk drive 2040 in the computer 1900 via the RAM 2020, to be executed by the CPU 2000.

The programs that are installed in the computer 1900 and cause the computer 1900 to function as the test apparatus 10 include a signal generating module, a signal detecting module, and a judging module. The programs or modules request the CPU 2000 and the like to cause the computer 1900 to function as the signal generating apparatus 12, the signal detecting apparatus 14, and the judging section 16.

The programs that are installed in the computer 1900 and cause the computer 1900 to function as the signal generating apparatus 12 include a pattern generating module, a cycle generating module, a signal generation timing generating module, a timing control module, a waveform shaping module, and a driver module. The programs or modules request the CPU 2000 and the like to cause the computer 1900 to function as the pattern generating section 20, the cycle generating section 22, the signal generation timing generating section 24, the timing control section 26, the waveform shaping section 28, and the driver 30.

The programs that are installed in the computer 1900 and cause the computer 1900 to function as the signal detecting apparatus 14 include a first comparing module, a second comparing module, a selection control module, a selecting module, a signal detection timing generating module, and a delay module. The programs or modules request the CPU 2000 and the like to cause the computer 1900 to function as the first comparing section 62, the second comparing section 64, the selection control section 66, the selecting section 68, the signal detecting timing generating section 70, and the delay circuit.

The programs or modules mentioned above may be stored on an external recording medium. Such a recording medium is, for example, an optical recording medium such as DVD and CD, a magnet-optical recording medium such as MO, a tape medium, a semiconductor memory such as an IC card and the like, in addition to the flexible disk 2090 and CD-ROM 2095. Alternatively, the recording medium may be a storage device such as a hard disk or RAM which is provided in a server system connected to a dedicated communication network or the Internet, and the programs may be provided to the computer 1900 via the network.

While the embodiments of the present invention has (have) been described, the technical scope of the invention is not limited to the above described embodiments. It is apparent to persons skilled in the art that various alterations and improvements can be added to the above-described embodiments. It is also apparent from the scope of the claims that the embodiments added with such alternations or improvements can be included in the technical scope of the invention.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A test apparatus for testing a device under test, comprising:
    a signal generating apparatus that inputs a pattern signal into the device under test;
    a signal detecting apparatus that detects an output signal output from the device under test; and
    a judging section that judges whether the device under test is acceptable based on the output signal detected by the signal detecting apparatus, wherein
    the signal detecting apparatus comprises:
        a first comparing section that detects a logic value of the output signal in accordance with a first timing signal having a predetermined cycle time;
        a second comparing section that detects a logic value of the output signal in accordance with a second timing signal having a different phase from the first timing signal;
        a selection control section that detects a waveform pattern of the output signal based on one of (i) the logic value of the output signal detected by the first comparing section and (ii) the logic value of the output signal detected by the second comparing section, and uses the waveform pattern to judge which one of the logic value detected by the first comparing section and the logic value detected by the second comparing section is to be selected as a data value of each cycle of the output signal;
        a selecting section that selects one of the logic value output from the first comparing section and the logic value output from the second comparing section based on the judgment made by the selection control section for each cycle of the output signal, and outputs the selected logic value;
        a timing generating section that generates the second timing signal; and
        a delay circuit that generates the first timing signal by delaying the second timing signal, wherein
    an output terminal of the device under test for outputting the output signal is connected to a first input terminal of the first comparing section and a first input terminal of the second comparing section,
    an output terminal of the timing generating section for outputting the second timing signal is connected to a second input terminal of the second comparing section and an input terminal of the delay circuit,
    an output terminal of the delay circuit for outputting the first timing signal is connected to a second input terminal of the first comparing section,
    an output terminal of the first comparing section is connected to a first input terminal of the selecting section, and
    an output terminal of the second comparing section is connected to a second input terminal of the selecting section.

2. A test apparatus for testing a device under test, comprising:
    a signal generating apparatus that inputs a pattern signal into the device under test;

a signal detecting apparatus that detects an output signal output from the device under test; and
a judging section that judges whether the device under test is acceptable based on the output signal detected by the signal detecting apparatus, wherein
the signal detecting apparatus comprises:
  a first comparing section that detects a logic value of the output signal in accordance with a first timing signal having a predetermined cycle time;
  a second comparing section that detects a logic value of the output signal in accordance with a second timing signal having a different phase from the first timing signal;
  a third comparing section that detects a logic value of the output signal at a substantially middle timing of each cycle of the output signal;
  a selection control section that detects a waveform pattern of the output signal based on the logic value of the output signal detected by the third comparing section, and uses the waveform pattern to judge which one of the logic value detected by the first comparing section and the logic value detected by the second comparing section is to be selected as a data value of each cycle of the output signal;
  a selecting section that selects one of the logic value output from the first comparing section and the logic value output from the second comparing section based on the judgment made by the selection control section for each cycle of the output signal, and outputs the selected logic value;
  a timing generating section that generates the second timing signal; and
  a delay circuit that generates the first timing signal by delaying the second timing signal, wherein
an output terminal of the device under test for outputting the output signal is connected to a first input terminal of the first comparing section and a first input terminal of the second comparing section,
an output terminal of the timing generating section for outputting the second timing signal is connected to a second input terminal of the second comparing section and an input terminal of the delay circuit,
an output terminal of the delay circuit for outputting the first timing signal is connected to a second input terminal of the first comparing section,
an output terminal of the first comparing section is connected to a first input terminal of the selecting section, and
an output terminal of the second comparing section is connected to a second input terminal of the selecting section.

3. The test apparatus as set forth in claim 1, wherein the delay circuit has a delay amount determined in accordance with a pattern dependent jitter amount to be generated by a transmission path from the device under test to the signal detecting apparatus when the output signal has edges in a vicinity of each other.

4. The test apparatus as set forth in claim 2, wherein the delay circuit has a delay amount determined in accordance with a pattern dependent jitter amount to be generated by a transmission path from the device under test to the signal detecting apparatus when the output signal has edges in a vicinity of each other.

5. An electronic device comprising:
a circuit under test; and
a test circuit that tests the circuit under test,
the test circuit comprising:
  a signal generating circuit that inputs a pattern signal into the circuit under test;
  a signal detecting circuit that detects an output signal output from the circuit under test; and
  a judging section that judges whether the circuit under test is acceptable based on the output signal detected by the signal detecting circuit, wherein
the signal detecting circuit comprises:
  a first comparing section that detects a logic value of the output signal in accordance with a first timing signal having a predetermined cycle time;
  a second comparing section that detects a logic value of the output signal in accordance with a second timing signal having a different phase from the first timing signal;
  a selection control section that detects a waveform pattern of the output signal based on one of (i) the logic value of the output signal detected by the first comparing section and (ii) the logic value of the output signal detected by the second comparing section, and uses the waveform pattern to judge which one of the logic value detected by the first comparing section and the logic value detected by the second comparing section is to be selected as a data value of each cycle of the output signal;
  a selecting section that selects one of the logic value output from the first comparing section and the logic value output from the second comparing section based on the judgment made by the selection control section for each cycle of the output signal, and outputs the selected logic value;
  a timing generating section that generates the second timing signal; and
  a delay circuit that generates the first timing signal by delaying the second timing signal, wherein
an output terminal of the device under test for outputting the output signal is connected to a first input terminal of the first comparing section and a first input terminal of the second comparing section,
an output terminal of the timing generating section for outputting the second timing signal is connected to a second input terminal of the second comparing section and an input terminal of the delay circuit,
an output terminal of the delay circuit for outputting the first timing signal is connected to a second input terminal of the first comparing section,
an output terminal of the first comparing section is connected to a first input terminal of the selecting section, and
an output terminal of the second comparing section is connected to a second input terminal of the selecting section.

6. An electronic device comprising:
a circuit under test; and
a test circuit that tests the circuit under test,
the test circuit comprising:
  a signal generating circuit that inputs a pattern signal into the circuit under test;
  a signal detecting circuit that detects an output signal output from the circuit under test; and
  a judging section that judges whether the circuit under test is acceptable based on the output signal detected by the signal detecting circuit, wherein
the signal detecting circuit comprises:
  a first comparing section that detects a logic value of the output signal in accordance with a first timing signal having a predetermined cycle time;

a second comparing section that detects a logic value of the output signal in accordance with a second timing signal having a different phase from the first timing signal;

a third comparing section that detects a logic value of the output signal at a substantially middle timing of each cycle of the output signal;

a selection control section that detects a waveform pattern of the output signal based on the logic value of the output signal detected by the third comparing section, and uses the waveform pattern to judge which one of the logic value detected by the first comparing section and the logic value detected by the second comparing section is to be selected as a data value of each cycle of the output signal;

a selecting section that selects one of the logic value output from the first comparing section and the logic value output from the second comparing section based on the judgment made by the selection control section for each cycle of the output signal, and outputs the selected logic value;

a timing generating section that generates the second timing signal; and a delay circuit that generates the first timing signal by delaying the second timing signal, wherein an output terminal of the device under test for outputting the output signal is connected to a first input terminal of the first comparing section and a first input terminal of the second comparing section, an output terminal of the timing generating section for outputting the second timing signal is connected to a second input terminal of the second comparing section and an input terminal of the delay circuit, an output terminal of the delay circuit for outputting the first timing signal is connected to a second input terminal of the first comparing section, an output terminal of the first comparing section is connected to a first input terminal of the selecting section, and an output terminal of the second comparing section is connected to a second input terminal of the selecting section.

7. A test apparatus for testing a device under test, comprising:

a signal generating apparatus that inputs a pattern signal into the device under test;

a signal detecting apparatus that detects an output signal output from the device under test; and a judging section that judges whether the device under test is acceptable based on the output signal detected by the signal detecting apparatus, wherein the signal detecting apparatus comprises:

a first comparing section that detects a logic value of the output signal in accordance with a first timing signal having a predetermined cycle time;

a second comparing section that detects a logic value of the output signal in accordance with a second timing signal having a different phase from the first timing signal;

a selection control section that detects a waveform pattern of the output signal based on one of (i) the logic value of the output signal detected by the first comparing section and (ii) the logic value of the output signal detected by the second comparing section, and uses the waveform pattern to judge which one of the logic value detected by the first comparing section and the logic value detected by the second comparing section is to be selected as a data value of each cycle of the output signal; and a selecting section that selects one of the logic value output from the first comparing section and the logic value output from the second comparing section based on the judgment made by the selection control section for each cycle of the output signal, and outputs the selected logic value, the test apparatus further comprising:

a timing generating section that generates the second timing signal; and a delay circuit that has a delay amount determined in accordance with a pattern dependent jitter amount to be generated by a transmission path from the device under test to the signal detecting apparatus when the output signal has edges in a vicinity of each other, the delay circuit generating the first timing signal by delaying the second timing signal, wherein an output terminal of the device under test for outputting the output signal is connected to a first input terminal of the first comparing section and a first input terminal of the second comparing section, an output terminal of the timing generating section for outputting the second timing signal is connected to a second input terminal of the second comparing section and an input terminal of the delay circuit, an output terminal of the delay circuit for outputting the first timing signal is connected to a second input terminal of the first comparing section, an output terminal of the first comparing section is connected to a first input terminal of the selecting section, an output terminal of the second comparing section is connected to a second input terminal of the selecting section, and the selection control section includes:

a vicinity judging section that judges whether an interval between each data value transition and an immediately preceding data value transition thereof is smaller than a predetermined interval; and a control section that causes the selecting section to select the logic value output from the second comparing section in cycles corresponding to data value transitions whose intervals are judged by the vicinity judging section to be smaller than the predetermined interval, and causes the selecting section to select the logic value output from the first comparing section in cycles corresponding to data value transitions whose intervals are not judged to be smaller than the predetermined interval.

8. A test apparatus for testing a device under test, comprising:

a signal generating apparatus that inputs a pattern signal into the device under test;

a signal detecting apparatus that detects an output signal output from the device under test; and a judging section that judges whether the device under test is acceptable based on the output signal detected by the signal detecting apparatus, wherein the signal detecting apparatus comprises:

a first comparing section that detects a logic value of the output signal in accordance with a first timing signal having a predetermined cycle time;

a second comparing section that detects a logic value of the output signal in accordance with a second timing signal having a different phase from the first timing signal;

a third comparing section that detects a logic value of the output signal at a substantially middle timing of each cycle of the output signal;

a selection control section that detects a waveform pattern of the output signal based on the logic value of the output signal detected by the third comparing section, and uses the waveform pattern to judge which one of the logic value detected by the first comparing section and the logic value detected by the second comparing section is to be selected as a data value of each cycle of the output signal; and a selecting section that selects one of the logic value output from the first comparing section and the logic value output from the second comparing section based on the judgment made by the selection control section for each cycle of the output signal, and outputs the selected logic value, the test apparatus further comprising:

a timing generating section that generates the second timing signal; and a delay circuit that has a delay amount determined in accordance with a pattern dependent jitter amount to be generated by a transmission path from the device under test to the signal detecting apparatus when the output signal has edges in a vicinity of each other, the delay circuit generating the first timing signal by delaying the second timing signal, wherein an output terminal of the device under test for outputting the output signal is connected to a first input terminal of the first comparing section and a first input terminal of the second comparing section, an output terminal of the timing generating section for outputting the second timing signal is connected to a second input terminal of the second comparing section and an input terminal of the delay circuit, an output terminal of the delay circuit for outputting the first timing signal is connected to a second input terminal of the first comparing section, an output terminal of the first comparing section is connected to a first input terminal of the selecting section, an output terminal of the second comparing section is connected to a second input terminal of the selecting section, and the selection control section includes:

a vicinity judging section that judges whether an interval between each data value transition and an immediately preceding data value transition thereof is smaller than a predetermined interval; and a control section that causes the selecting section to select the logic value output from the second comparing section in cycles corresponding to data value transitions whose intervals are judged by the vicinity judging section to be smaller than the predetermined interval, and causes the selecting section to select the logic value output from the first comparing section in cycles corresponding to data value transitions whose intervals are not judged to be smaller than the predetermined interval.

* * * * *